United States Patent
Deng

(10) Patent No.: US 12,094,519 B2
(45) Date of Patent: Sep. 17, 2024

(54) DATA READ/WRITE METHOD, DEVICE, AND MEMORY HAVING THE SAME

(71) Applicant: Changxin Memory Technologies, Inc., Anhui (CN)

(72) Inventor: Shengcheng Deng, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 607 days.

(21) Appl. No.: 17/222,641

(22) Filed: Apr. 5, 2021

(65) Prior Publication Data

US 2021/0264962 A1  Aug. 26, 2021

Related U.S. Application Data

(63) Continuation of application No. PCT/CN2019/118878, filed on Nov. 15, 2019.

(30) Foreign Application Priority Data

Nov. 29, 2018  (CN) .......................... 201811446001.3

(51) Int. Cl.
*G11C 11/409*  (2006.01)
*G06F 12/06*  (2006.01)

(52) U.S. Cl.
CPC ............ *G11C 11/409* (2013.01); *G06F 12/06* (2013.01); *G06F 2212/70* (2013.01)

(58) Field of Classification Search
CPC ... G11C 11/409; G11C 11/4096; G06F 12/06; G06F 2212/70; G06F 3/061; G06F 3/0638; G06F 3/0673
See application file for complete search history.

(56) References Cited

U.S. PATENT DOCUMENTS

| 7,793,037 B2 | 9/2010 | Jain et al. |
| 9,335,953 B2 | 5/2016 | Fujimoto et al. |

(Continued)

FOREIGN PATENT DOCUMENTS

| CN | 101185140 A | 5/2008 |
| CN | 101719101 A | 6/2010 |

(Continued)

OTHER PUBLICATIONS

PCT International Search Report and the Written Opinion mailed Feb. 24, 2020, issued in related International Application No. PCT/CN2019/118878 (7 pages).

(Continued)

*Primary Examiner* — Masud K Khan
(74) *Attorney, Agent, or Firm* — Sheppard Mullin Richter & Hampton LLP

(57) ABSTRACT

A data read/write method and device, as well as a dynamic random-access memory (DRAM) having the same are disclosed. The method may include: entering a page read/write mode configured by a reserved bit in a mode register of the DRAM; receiving a page read/write command including a page read/write enable command configured by a reserved bit in a read/write command of the DRAM; and performing a page read/write operation according to the page read/write command. This method may allow a greater amount of data to be handled by each read/write command, thereby reducing the number of required read/write commands. As a result, a higher read/write rate and lower power consumption can be achieved.

11 Claims, 5 Drawing Sheets

(56) References Cited

U.S. PATENT DOCUMENTS

| | | | |
|---|---|---|---|
| 10,020,036 B2 | 7/2018 | Gupta et al. | |
| 2014/0160876 A1* | 6/2014 | Gupta | G11C 8/00 365/238.5 |
| 2015/0234595 A1* | 8/2015 | Satou | G06F 12/0868 711/113 |
| 2016/0378366 A1* | 12/2016 | Tomishima | G11C 8/12 711/154 |
| 2017/0017434 A1 | 1/2017 | Bang et al. | |
| 2017/0160946 A1 | 6/2017 | Kodera et al. | |

FOREIGN PATENT DOCUMENTS

| | | |
|---|---|---|
| CN | 102142236 A | 8/2011 |
| CN | 102684976 A1 | 9/2012 |
| CN | 103403803 A | 11/2013 |
| CN | 103870412 A | 6/2014 |
| CN | 104156907 A | 11/2014 |
| CN | 104850355 A | 8/2015 |
| CN | 105572565 A | 5/2016 |
| CN | 105575419 A | 5/2016 |
| CN | 106356087 A | 1/2017 |
| CN | 106547483 A | 3/2017 |
| CN | 107667403 A | 2/2018 |

OTHER PUBLICATIONS

First Search dated Dec. 21, 2020, issued in related Chinese Application No. 201811446001.3 (1 page).

PCT International Preliminary Report on Patentability mailed Jun. 10, 2021, issued in related International Application No. PCT/CN2019/118878 (6 pages).

First Office Action dated Jan. 7, 2021, issued in related Chinese Application No. 201811446001.3, with English machine translation (13 pages).

Supplementary Search dated Jun. 8, 2021, issued in related Chinese Application No. 201811446001.3 (1 page).

Second Office Action dated Jul. 5, 2021, issued in related Chinese Application No. 201811446001.3, with English machine translation (14 pages).

Supplementary Search dated Oct. 19, 2021, issued in related Chinese Application No. 201811446001.3 (1 page).

\* cited by examiner

MR1 Register Information(ma[5:0]=01_H)

| OP[7] | OP[6] | OP[5] | OP[4] | OP[3] | OP[2] | OP[1] | OP[0] |
|---|---|---|---|---|---|---|---|
| RPST | nWR(for AP) | | | RD-PRE | WR-PRE | BL | |

Fig. 6

| Fuction | Register Type | Operand | Data | Note |
|---|---|---|---|---|
| BL (Burst Length) | | OP[1:0] | $00_B$: BL=16 Sequential(defalt)<br>$01_B$: BL=32 Sequential<br>$10_B$: BL=16 or 32 Sequential(on-the-fly)<br>All Others: Reserved | 1,7 |

Fig. 7

| Fuction | Register Type | Operand | Data | Note |
|---|---|---|---|---|
| BL (Burst Length) | | OP[1:0] | $00_B$: BL=16 Sequential(defalt)<br>$01_B$: BL=32 Sequential<br>$10_B$: BL=16 or 32 Sequential(on-the-fly)<br>$11_B$: BL=16 or 32 or partial page Sequential | 1,7 |

Fig. 8

|  | SDR Command Pins | SDR CA Pins(6) | | | | | | | |
|---|---|---|---|---|---|---|---|---|---|
| SDRAM Command | CS | CA0 | CA1 | CA2 | CA3 | CA4 | CA5 | CK_t edge | Notes |
| Write-1(WR-1) | H | L | L | H | L | L | (BL) | R1 | 1,2,3,6,7,9,13 |
|  | L | BA0 | BA1 | BA2 | (V) | C9 | AP | R2 |  |
| Read-1(RD-1) | H | L | H | L | L | L | (BL) | R1 | 1,2,3,6,7,9,13 |
|  | L | BA0 | BA1 | BA2 | (V) | C9 | AP | R2 |  |
| CAS-2(Write-2, Mask Write-2, Read-2,MRR-2, MPC) | H | L | H | L | L | H | C8 | R1 | 1,8,9 |
|  | L | (C2) | (C3) | C4 | C5 | C6 | C7 | R2 |  |

Fig. 9

| Read-1(RD-1) | H | L | H | L | L | L | (L) | R1 |
|---|---|---|---|---|---|---|---|---|
|  | L | BA0 | BA1 | BA2 | (L) | C9 | AP | R2 |
| CAS-2(Write-2,Mask Write-2, Read-2,MRR-2,MPC) | H | L | H | L | L | H | C8 | R1 |
|  | L | C2 | C3 | C4 | C5 | C6 | C7 | R2 |

Fig. 10

| Read-1(RD-1) | H | L | H | L | L | L | (H) | R1 |
|---|---|---|---|---|---|---|---|---|
|  | L | BA0 | BA1 | BA2 | (L) | C9 | AP | R2 |
| CAS-2(Write-2,Mask Write-2, Read-2,MRR-2,MPC) | H | L | H | L | L | H | C8 | R1 |
|  | L | C2 | C3 | C4 | C5 | C6 | C7 | R2 |

Fig. 11

| Read-1 (RD-1) | H | L | H | L | L | L | (L) | R1 |
|---|---|---|---|---|---|---|---|---|
| | L | BA0 | BA1 | BA2 | (H) | C9 | AP | R2 |
| CAS-2(Write-2,MASk Write-2, Read-2, MRR-2.MPC) | H | L | H | L | L | H | C8 | R1 |
| | L | C2 | C3 | C4 | C5 | C6 | C7 | R2 |

| Read-1 (RD-1) | H | L | H | L | L | L | (H) | R1 |
|---|---|---|---|---|---|---|---|---|
| | L | BA0 | BA1 | BA2 | (H) | C9 | AP | R2 |
| CAS-2(Write-2,MASk Write-2, Read-2, MRR-2.MPC) | H | L | H | L | L | H | C8 | R1 |
| | L | C2 | C3 | C4 | C5 | C6 | C7 | R2 |

DATA READ/WRITE METHOD, DEVICE, AND MEMORY HAVING THE SAME

CROSS-REFERENCE TO RELATED APPLICATIONS

This application is a continuation application of International Patent Application No. PCT/CN2019/118878, filed on Nov. 15, 2019, which is based on and claims priority to and benefits of the Chinese Patent Application No. 201811446001.3, filed with the China National Intellectual Property Administration (CNIPA) of the People's Republic of China on Nov. 29, 2018. The entire contents of the above-referenced applications are incorporated herein by reference.

TECHNICAL FIELD

The present disclosure relates to the technical field of memory devices and, more specifically, to a method and a device of data read/write, and a memory having the same.

BACKGROUND

With the rapid development of the storage technology, there are increasing demands for the storage/memory devices that can be read and written faster and consume less power.

As the data requested from the memory is often large, and existing memory devices only support a short read/write length, typically, multiple read/write commands are needed to process one data access request, resulting in a limited read/write rate. Moreover, for executing each read/write command, various internal processing circuits of the memory would need to operate and consume powers, causing a higher overall power consumption of the memory.

It is to be noted that the information disclosed in this Background section is only for providing a better understanding of the background or context of the invention, and therefore may contain information that does not form the prior art that is already known to a person of ordinary skill in the art.

SUMMARY OF THE DISCLOSURE

The present disclosure provides a data read/write method to overcome one or more problems in existing read/write methods in prior art.

The present disclosure also provides a data read/write device and a dynamic random-access memory (DRAM) suitable for the data read/write method to apply.

One aspect of the present disclosure may direct to a data read/write method, applied to a dynamic random access memory (DRAM), and comprising entering a page read/write mode configured by a reserved bit in a mode register of the DRAM, receiving a page read/write command including a page read/write enable command configured by a reserved bit in a read/write command of the DRAM, and performing a page read/write operation according to the page read/write command.

In an exemplary embodiment of the present disclosure, the page read/write mode may be configured by a reserved bit in the mode register of the DRAM for configuring a burst mode.

In an exemplary embodiment of the present disclosure, the page read/write command may further comprise a page read/write length command which indicates a read/write length of each page read/write operation and is configured by a burst length bit in the read/write command of the DRAM.

In an exemplary embodiment of the present disclosure, the page read/write length command may be configured by both the burst length bit in the read/write command of the DRAM and at least one column address bit.

In an exemplary embodiment of the present disclosure, the at least one column address bit may include one or two bits.

In an exemplary embodiment of the present disclosure, the page read/write operation may read or write data in N/16 of one page, where $1 \leq N \leq 16$, and N is a natural number.

In an exemplary embodiment of the present disclosure, N=1, 2, 4 or 8.

In an exemplary embodiment of the present disclosure, the DRAM may include a Low-Power Double Data Rate 4 (LP-DDR4) synchronous DRAM (SDRAM), the reserved bit in the mode register may include a reserved bit in an MR1 mode register to configure a burst mode, the burst length bit may include a command bit corresponding to a CA5 pin, and the reserved bit in the read/write command may include a reserved command bit corresponding to a CA3 pin.

In an exemplary embodiment of the present disclosure, the DRAM may include a Low-Power Double Data Rate 4 (LP-DDR4) synchronous DRAM (SDRAM), the reserved bit in the mode register may include a reserved bit in an MR1 mode register to configure a burst mode, the burst length bit may include a command bit corresponding to a CA5 pin, the reserved bit in the read/write command may include a reserved command bit corresponding to a CA3 pin, and the at least one of column address bit may include a column address bit corresponding to a CA0 pin or column address bits corresponding to CA0 and CA1 pins.

In an exemplary embodiment of the present disclosure, the page read/write operation may be performed in a linear manner automatically.

In an exemplary embodiment of the present disclosure, the page read/write operation may be performed across different pages or not across different pages.

In an exemplary embodiment of the present disclosure, the read/write length may be configured with respect to a data amount requested by the page read/write command.

In an exemplary embodiment of the present disclosure, the linear manner may include a starting address and an increment from the starting address in each iteration.

In an exemplary embodiment of the present disclosure, each of the reserved bit in the mode register and the reserved bit in the read/write command comprises one or two bits.

Another aspect of the present disclosure may direct a data read/write device, comprising a command receiving circuit configured to receive a page read/write command which is configured by a reserved bit in a read/write command of a dynamic random access memory (DRAM), a command decoding circuit coupled to the command receiving circuit and configured to decode the page read/write command, a mode register, configured with a page read/write mode and coupled to the command decoding circuit, and an addressing circuit coupled to the mode register and configured to select an address for reading/writing data according to the page read/write command to perform a page read/write operation in the page read/write mode.

Another aspect of the present disclosure may direct to a dynamic random-access memory (DRAM), comprising the data read/write device as defined above.

In an exemplary embodiment of the present disclosure, the DRAM may include at least one of a Double Data Rate 4 (DDR4) synchronous DRAM (SDRAM), a Low-Power Double Data Rate 4 (LP-DDR4) SDRAM, a Double Data Rate 5 (DDR5) SDRAM, and a Low-Power Double Data Rate 5 (LP-DDR5) SDRAM.

According to the present disclosure, a greater amount of data can be processed by each read/write command in a DRAM, by using reserved bits in a mode register of the DRAM as a switch of a page read/write mode and reserved bits in a read/write command as an enable command for enabling the page read/write operations. This can reduce the required data read/write time and increase a data read/write rate. Moreover, since the number of required read/write commands is reduced, the relevant circuits can be triggered less frequently, and overall power consumption of the memory can be lowered significantly. Further, the reserved bits in the memory can be made full use of, dispensing with the need and cost to design new memories.

It is to be understood that both the foregoing general description and the following detailed description are exemplary and explanatory only and are not restrictive of this disclosure.

BRIEF DESCRIPTION OF THE DRAWINGS

The accompanying drawings, which are incorporated in and constitute a part of the description, illustrate embodiments consistent with the present disclosure and, together with the description, serve to explain the disclosed principles. It is obvious that these drawings present only some embodiments of the present disclosure and those of ordinary skill in the art may obtain drawings of other embodiments from the accompanying drawings without exerting any creative effort.

FIG. 6 shows a standard LPDDR4 MR1 configuration according to the JEDEC specification according to an embodiment of the present disclosure.

FIG. 7 shows a standard configuration of a LPDDR4 MR1 burst mode according to the JEDEC specification according to an embodiment of the present disclosure.

FIG. 8 shows a configuration of reserved bits in the LPDDR4 MR1 burst mode according to an embodiment of the present disclosure.

FIG. 9 shows a truth table for read/write commands of an LPDDR4 according to an embodiment of the present disclosure.

FIG. 10 shows a truth table for a BL16 read/write command according to an embodiment of the present disclosure.

FIG. 11 shows a truth table for a BL32 read/write command according to an embodiment of the present disclosure.

DETAILED DESCRIPTION

Figure 1:
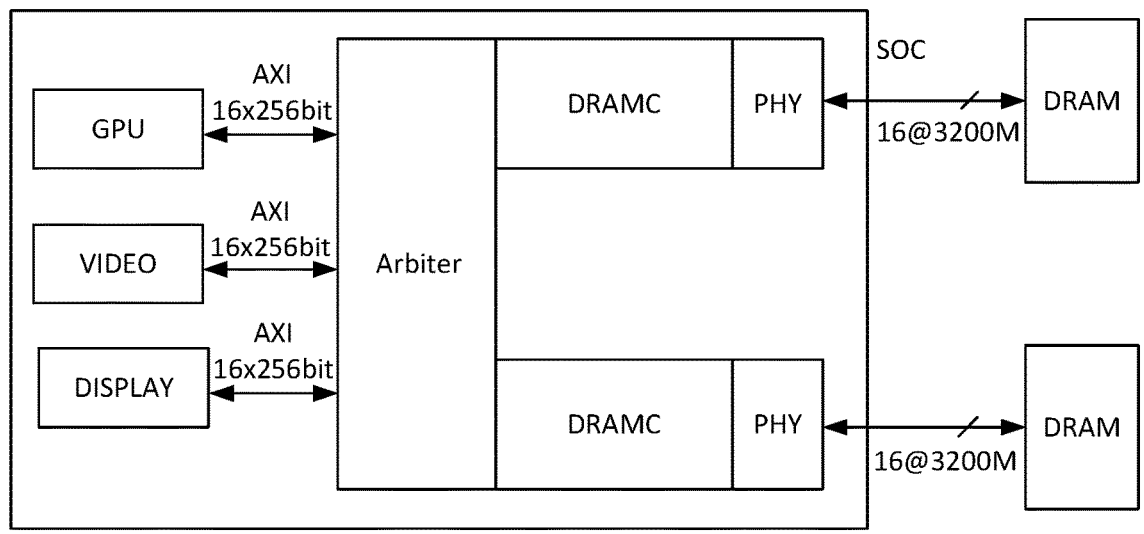
FIG. 1 shows a data access architecture of an embodiment of the present disclosure.

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of the present disclosure and to fully convey the concepts of the exemplary embodiments to others skilled in the art. Throughout the figures, like reference numerals indicate identical or similar elements, so any duplicate description of them will be omitted.

As shown in FIG. 1, most existing system-level chips including GPU, video, and display, employ Advanced extensible Interface (AXI) interfaces for direct memory access (DMA) to access dynamic random-access memories (DRAMs). Such an AXI interface has a typical bit width (axi_size) of 256 bits and a typical data length of 8 or 16, that is, each data access request requires 8 or 16 data chunks of 256 bits.

Figure 2:
FIG. 2 is an illustration of a conventional data read/write mode of prior art.

For example, an existing Low-Power Double Data Rate 4 (LP-DDR4) synchronous dynamic random access memory (SDRAM) supports, in a burst read/write mode, a burst length of 32 or 16 (i.e., BL32 or BL16) and a DQ byte-width of 16 bits. That is, each read/write command allows the reading/writing of 32×16 or 16×16 bits. In the case of BL16, where each read/write command handles 16×16 bits, 16 such commands can satisfy one access request from the AXI interface, which requires the handling of 16×256 bits, as shown in FIG. 2. Similarly, a burst length of 32 will require 8 such read/write commands. Each of these commands may lead to some power consumed due to operations of circuits of the input/output (I/O) of DRAM, I/O at a chip system-level, and command processing at a chip system-level. More power may be consumed by termination resistors triggered when the LPDDR4 device is operating at a high speed. Due to such high power-consuming data read/write operations, the overall power consumption of the existing memory devices is high.

In embodiments of the present disclosure, a data read/write method is provided for allowing a high read/write rate with lower power consumption. This method may be suitable for use with any one of a Double Data Rate 4 (DDR4) SDRAM, a LP-DDR4 SDRAM, a Double Data Rate 5 (DDR5) SDRAM, and a Low-Power Double Data Rate 5 (LP-DDR5) SDRAM.

Figure 3:
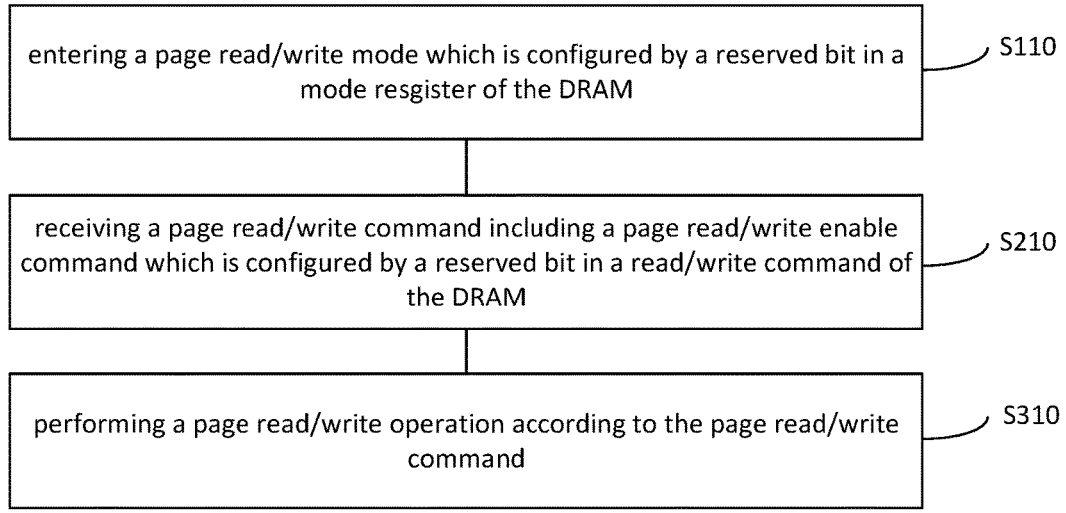
FIG. 3 is a flowchart of a data read/write method according to an embodiment of the present disclosure.

As shown in FIG. 3, a data read/write method applied to data read/write operations of a DRAM according to an embodiment of the present disclosure may include the following steps.

In Step S110, a page read/write mode configured by reserved bits in a mode register of the DRAM is entered.

In Step S210, a page read/write command including a page read/write enable command configured by reserved bits in a read/write command of the DRAM is received.

In Step S310, a page read/write operation is performed according to the page read/write command.

A typical page size of a SDRAM device is 1 KB or 2 KB. One page may be equally partitioned into a number of segments. Each segment may be taken as a read/write length of each read/write command, so that a greater amount of data can be read or written by each read/write command.

Figure 4:
FIG. 4 illustrates a data read/write mode according to an embodiment of the present disclosure.

Such a page read/write command can dramatically increase the amount of data that can be read or written by a single command, for example, up to 16×256 bits, compared to 32×16 or 16×16 bits by a conventional burst read/write command. In this way, one data access request can be fulfilled with only a single read/write command, as shown in FIG. 4.

Conventional memories typically maintain some reserved bits for extension. These reserved bits may be used to construct page read/write commands. In this way, such existing memories may be made full use of, dispensing with the need and cost to design a new memory. According to the embodiment of the present disclosure, a page read/write operation can be performed in a DRAM by using reserved bits in a mode register of the DRAM as a switch of a page read/write mode and reserved bits in a read/write command as an enable command for enabling the page read/write operations. This can reduce the time required for data access and allow a higher data read/write rate. Moreover, since the number of required read/write commands is reduced, the relevant circuits may be triggered less frequently, greatly lowering the memory's overall power consumption. Further, the reserved bits in the existing memory can be made full use of, dispensing with the need and cost to design new memories.

The data read/write method disclosed in embodiments of the present disclosure will be described in greater detail below using a LPDDR4 SDRAM as an example.

As used herein, a data "read/write" process may include reading data from and writing data into a memory. Therefore, the data read/write method of the present disclosure may comprise a data read method and a data write method. Similarly, as used herein, a read/write method, command, or mode may comprise a read method, command, or mode, and a write method, command, or mode. In addition, the method of the present disclosure may be used either to read data from or write data into a memory, or to simultaneously read data from and write data into a memory.

As used herein, a "page" may correspond to a collection of each row of a memory bank. A read/write data operation may be performed under a page read/write command with a read/write length of a fraction of each page's data amount. The mode register may be configured to set a certain operating mode of the memory. The mode register of the memory may be configured to a page read/write operating mode to perform the page read/write operations. Specifically, the operating mode for the page read/write operation may be configured with reserved bits in the mode register, such that the reserved bits may serve as a switch for enabling or disabling the page read/write mode. In this way, the reserved bits in the mode register can be fully utilized.

Figure 5:
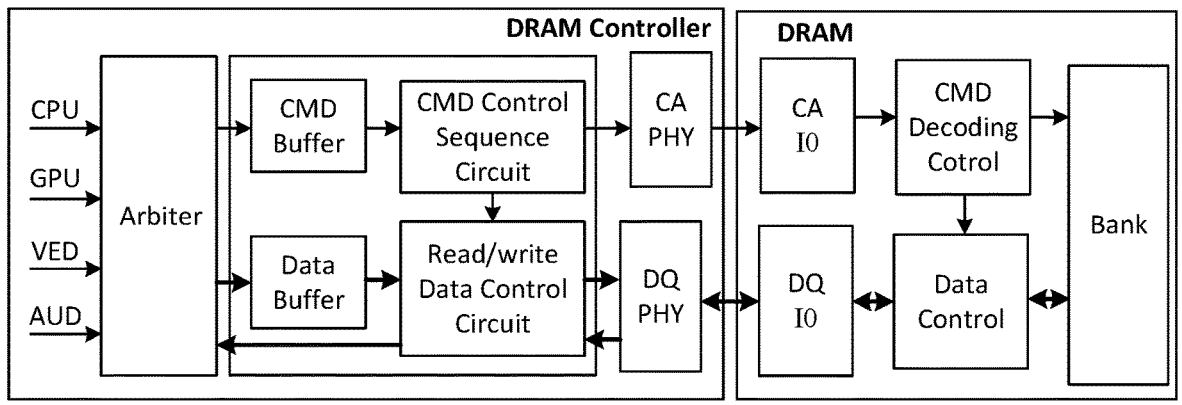
FIG. 5 is a schematic diagram illustrating a data read/write operation performed on a memory according to an embodiment of the present disclosure.

The page read/write commands may be sent to the DRAM by a memory controller (DRAM controller) configured to coordinate signal interactions between a central processing unit (CPU) in a control system and the DRAM to ensure valid data transfers, as shown in FIG. 5. The memory controller may configure the row addresses, column addresses, an access timing, refresh constraints, timing parameters, etc., and create the read/write commands according to read/write requests to achieve data transfers. Of course, the memory controller may be configured to create only page read/write commands, or page read/write commands and burst read/write commands. In this way, data read/write of the memory may be accomplished by page read/write operations, or other read/write operations such as burst read/write operations.

In this embodiment of the present disclosure, in step S110, the page read/write mode is configured by reserved bits in the mode register of the DRAM for configuring a burst mode.

Specifically, according to the Joint Electron Tube Engineering Council (JETEC) specification, among existing LPDDR4 mode registers, an MR1 mode register has 8 bits for storing various operating modes including pre-write, pre-read, burst length, etc. As shown in FIG. 6, 2 out of the 8 bits are reserved to configure a burst read/write mode, and burst lengths are configured by binary numbers. As shown in FIG. 7, conventionally, "00" represents a burst length of 16 (default), "01" represents a burst length of 32, and "10" represents a burst length of 16 or 32 (on the fly), and "11" are reserved. As such, in the present disclosure, the reserved "11" may be utilized to configure a page read/write mode. For example, as shown in FIG. 8, the reserved "11" may be configured as any of the following three modes, BL16 burst, BL32 burst, and page read/write. In other words, the memory may perform either in a burst read/write or a page read/write at the reserved "11". In some other types of DRAMs in which the burst lengths may be defined by a three-digit binary number, the page read/write mode may be accordingly configured by a three-digit binary number. In other types of DRAM in which the burst lengths may be configured in other mode registers, the page read/write mode according to the present disclosure may be configured by reserved burst length bits in those mode registers. Of course, although not enumerated herein, the page read/write mode may also be configured by reserved bits in the mode register for other functions.

In step S210, the page read/write commands may contain a read/write enable command indicating whether the page read/write operations are to be performed. The read/write enable command may be configured by reserved bits in read/write commands of the DRAM. In this way, full utilization of reserved bits in the read/write commands can be achieved. According to the page read/write commands, data may be written into or read from the memory.

For example, in the LPDDR4 mode register as shown in FIG. 9, a bit in the read/write command corresponding to a CA3 pin is a reserved bit and utilized to configure the page read/write enable command in this embodiment. When a high level voltage is received at the corresponding pin, page read/write operations may be performed. When the received voltage level is low, burst read/write operations may be performed. For the example of an AXI command for reading 16×256 bits, a burst read operation may be performed when the CA3 pin is at a low level, and a page read operation will be performed when the CA3 pin is at a high level.

In an embodiment of the present disclosure, in step S210, the page read/write command may further include a page read/write length command indicating a read/write length of each page read/write operation. The page read/write length command may be configured by burst length bits in the read/write command of the DRAM, so that the burst length bits may be used to choose a burst length in the burst read/write mode or to choose a page read/write length in the page read/write mode.

As shown in FIG. 10, a bit in the LPDDR4 controller read/write command corresponding to a CA5 pin and reserved as a burst length (BL) bit may be utilized as the page read/write length command for choosing a page read/write length in this embodiment. In this embodiment, the page read/write length command may comprise two different read/write lengths. For example, in the page read/write mode, when the burst length bit is at a high level, each page read/write command may read or write ¼ page of data. For example, for an AXI access command requesting a read of 16×256 bits of data, as the data amounts of 16×256 bits are 512 bytes (B) or ¼ page, the length of the data is ¼ page. Thus, the data can be read with only one-page command in one read operation, thereby greatly reducing the number of required commands. When the burst length bit is at a low level, each read command may read ⅛ page of data, so two page read commands may be needed to read the requested data. The same may apply to write requests. In addition, the page read/write length represented by the burst length bit may comprise other lengths, for example, ⅛ page at high level and ⅜ page at low level, or ⁵⁄₁₆ page at low level and ⅛ page at high level. As long as they are different at different levels, one of the two different page read/write lengths may be chosen to meet the needs of different amounts of requested data.

Figures 12, 13, 14:
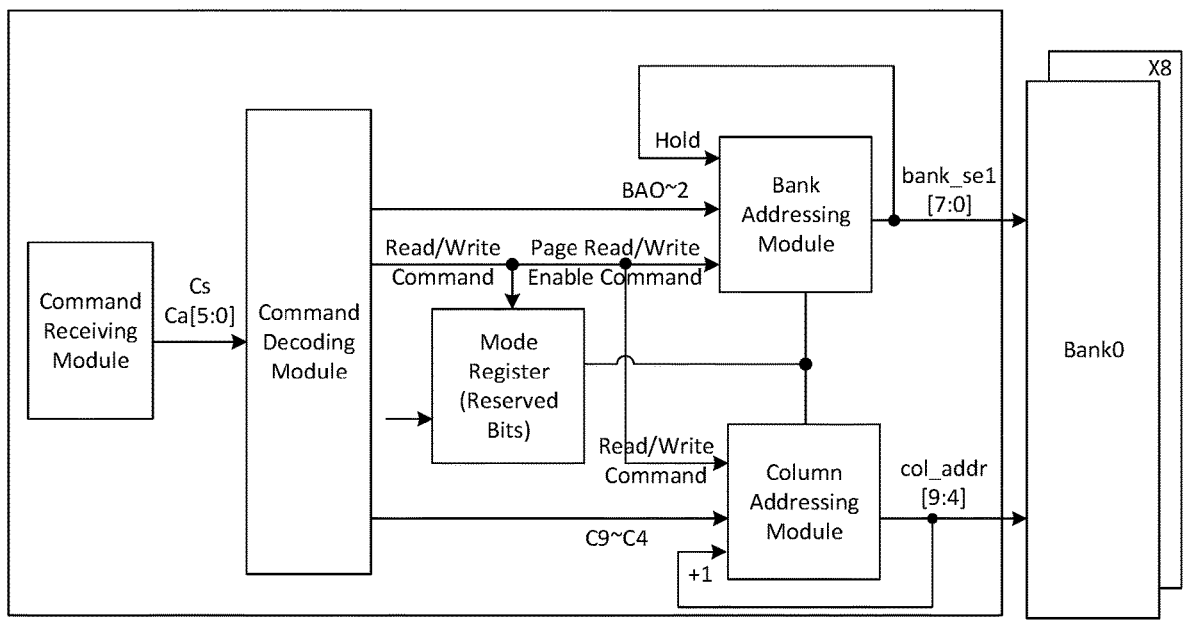
FIG. 12 shows a command truth table for a page read/write length of ⅛ page according to an embodiment of the present disclosure.
FIG. 13 shows a command truth table for a page read/write length of ¼ page according to an embodiment of the present disclosure.
FIG. 14 shows the architecture of a circuit for performing page read/write operations in accordance with the present disclosure.

A page read/write operation according to the present disclosure will be described in greater detail below in continuation with the example of an AXI access command requesting a read of 16×256 bits data. The data read process may begin with checking the binary value of the burst mode bits in the mode register. If it is "11", data may be read either in a burst manner or in a page manner. If the level of the pin CA3 is low, data may be read in bursts. Subsequently, if the level of the pin CA5 is low, the data may be read at a burst length (BL) of 16 and require 16 commands, as shown in FIG. 10. If CA5 is high, the BL is 32, and the data may be read with 8 commands, as shown in FIG. 11. If CA3 is high, page read may be performed. In this case, data may be read with 2 commands with a page read length of ⅛ page when CA5 is low, as shown in FIG. 12. Only one command may be need to read data with a page read length of ¼ page when CA5 is high, as shown in FIG. 13. As can be seen, the page read approach requires far fewer read operations.

As the above embodiment provides only two read/write length options, applications thereof are rather limited. In order to address more diverse data amounts that may be requested, the range of available page read/write lengths may be expanded to provide more options. For the example of LPDDR4, if the available page read/write length options only comprise ¹⁄₁₆ page and ⅛ page, then at least two page read/write commands will be needed to fulfill a task requiring a ¼ page data transfer. If an additional page read/write length of ¼ page is configured, then the task can be accomplished with only one page read/write command, thereby further lowering the power consumed in the read/write process. Accordingly, in one embodiment of the present disclosure, the page read/write length command may be configured by both the burst length bits in the read/write command of the DRAM and one or more column address bits. In the page read/write mode, the column address bits may encode an access length, and together with the burst length bit in the page read/write command, provide binary numbers of two, three, or more digits of, thus providing more page read/write length options. The burst length bit may be combined with 1 column address bit to provide a 2-digit binary number offering 3 or 4 page read/write length options, or with 2 column address bits to provide a 3-digit binary number offering 4 to 8 page read/write length options, or with 3 column address bits to provide 4-digit binary number offering 9 to 16 page read/write length options, and so forth. In this way, a more suitable page read/write length can be chosen for an access request of a certain amount of data in order to minimize the number of required page read/write commands. As a result, a higher read/write rate and lower power consumption can be achieved.

In one embodiment of the present disclosure, the number of the column address bits may be one or two, and the read/write length command may comprise 3-8 different read/write lengths accordingly, which can apply to existing available DRAM devices. For example, in an embodiment of the present disclosure, as shown in FIGS. 9, C2 and C3 column address bits corresponding to the CA0 and CA1 pins of the LPDDR4, respectively, may be used for page read/write length encoding. They can be combined with the burst length bit corresponding to CA5 to provide a 3-digit binary number offering up to 8 page read/write length options. Alternatively, only the C2 column address bit corresponding to CA0 may be selected and combined with the burst length bit corresponding to CA5 to provide a 2-digit binary number offering up to 4 page read/write length options. In this case, the C3 column address bit corresponding to CA1 can be used for column addressing.

In one embodiment of the present disclosure, each read/write command may enable a read/write of data in an amount equal to N/16 of that contained in one page, where $1 \le N \le 16$, and N is a natural number. By dividing the data in one page into 16 chunks, the amount handled in each read/write operation may range from ¹⁄₁₆ of the data to the whole of it. N may be either even or odd. This can be configured by the page read/write length command according to actual requirement.

In one embodiment of the present disclosure, N may be equal to 1, 2, 4 or 8, corresponding to a data read/write length of ¹⁄₁₆, ⅛, ¼, or ½ of one page for each page read/write command. With this arrangement, data transfer requirements of existing LPDDR4 devices can be well satisfied. For example, a page data size of a LPDDR4 device is usually 1 KB or 2 KB. When a page data size is 2 KB, and one AXI access command requests 16×256 bits of data, given 16×256 bits=512B=¼ page, the AXI access command may be fulfilled with only one page read/write command configured with a page read/write length of ¼ page (i.e., N=4) according to this embodiment. If the read/write length is chosen as ⅛ page (i.e., N=8), then two page read/write commands will be required. Similarly, in case of a page data size is 1 KB, an AXI access request to 8×256 bits (i.e., 256B or ⅛ page) can be handled with one page read/write command with a read/write length of ⅛ page (i.e., N=8) or with two page read/write commands with a read/write length of ¹⁄₁₆ page (i.e., N=16). As another example, for a page data size of 1 KB, an AXI access request to 16×256 bits (i.e., 512B or ½ page) can be accomplished with one page read/write command with a read/write length of ½ page (i.e., N=2) or with two page read/write commands with a read/write length of ¼ page (i.e., N=4). Although not further listed herein, in other embodiments of the present disclosure, N may also be set to 1, 2, 4, or 8 for a LPDDR5, DDR4, or DDR5 device.

In one embodiment of the present disclosure, a page read/write operation may be performed in a linear manner from a certain starting address along a certain read/write direction. That is, a byte data may be received or written in an automatic manner simply by incrementing the address by at least one iteratively. Linear burst data transfers may efficiently utilize the bus bandwidth for transferring data with less unnecessary addressing actions. In other embodiments of the present disclosure, a page read/write operation may also be performed in a cross-over manner.

In one embodiment of the present disclosure, a page read/write operation may be performed across different pages or not cross different pages. The read/write method of the present disclosure is applicable to memories that support cross-page reading/writing. That is, if the current page read/write command is not completed yet when data of the current page has been read/written, the current page read/write command may continue a new page until the command is completed. For example, at a page read/write length of 5/8 page, a first page read/write command may handle 5/8 of the current page, and a second page read/write command will handle the remaining 3/8 of the current page and 2/8 of the next page. The read/write method of the present disclosure may also be applied to memories that do not support cross-page reading/writing. In this case, each command must be completed within the same page. For example, at a page read/write length of 5/8 page, a first page read/write command may handle 5/8 of the current page, and a second page read/write command may handle 5/8 of the next page.

It will be appreciated by those skilled in the art that, in the above embodiments, the different read/write modes and read/write lengths represented by the voltage levels may be interchangeable, and the present disclosure is not particularly limited in this regard.

In embodiments of the present disclosure, there is also provided a data read/write device for implementing the data read/write method as disclosed above, to allow page-wise data reading/writing in a memory. For example, as shown in FIG. 14, the device may include a command receiving circuit, a command decoding circuit, a mode register, and an addressing circuit. The command receiving circuit is configured to receive a page read/write command as described above from CA pins. The command decoding circuit is coupled to the command receiving circuit and configured to decode the page read/write commands. The mode register is provided with a page read/write mode and is configured to select and activate the page read/write mode. The addressing circuit is coupled to the mode register and configured to select addresses for reading/writing data according to the page read/write commands to perform page read/write operations in the page read/write mode.

The addressing circuit may include a bank addressing circuit and a column addressing circuit. The bank selecting circuit is coupled to both the command decoding circuit and the mode register and is configured to selecting a bank for reading/writing data according to the page read/write command and the page read/write mode. The column addressing circuit is coupled to both the command decoding circuit and the mode register and is configured to select a column address for reading/writing data according to the page read/write commands and the page read/write modes.

When receiving the page read/write commands, the read/write device decodes the commands and activates the page read/write mode. The bank addressing circuit then selects a bank, and the column addressing circuit selects a column, to perform the read/write operations. Once a bank is selected, a data read/write process may proceed therein. Once a column is selected by the column addressing circuit, the data read/write process may proceed in an automatic and continuous manner, across columns consecutively addressed by the column addressing circuit through incrementing the selected address by one iteratively. The number of the iterations may be determined by the page read/write length, i.e., the aforementioned read/write length represented by the combination of the bit corresponding to CA5 and the column address bit(s).

In embodiments of the present disclosure, there is also provided a DRAM comprising the data read/write device as disclosed above. The memory may handle a greater amount of data in each read/write operation, thereby reducing the number of required read/write operations. As a result, a higher read/write rate and lower overall power consumption can be achieved.

The DRAM may include any one of a DDR4 SDRAM, a LP-DDR4 SDRAM, a DDR5 SDRAM, and a LP-DDR5 SDRAM.

Although relative terms such as "upper" and "lower" may be used herein to describe a spatial relationship of one component to another in a device shown in the figures, they are used merely for the purpose of easy description based on, for example, the exemplary orientation depicted in the figures. It is to be understood that if the illustrated device is turned upside down, then the component described as being "upper" will now be a "lower" component. When a certain structure is described as "on" another structure, it is possible that the specific structure is either integrally formed on the other structure or disposed thereon "directly" or "indirectly" via an intervening structure.

As used herein, the terms "a", "an", "the", "said" and "at least one" are intended to mean that there is one or more elements/components/etc. As used herein, the terms "comprising" and "having" are intended to be used in an open-ended sense to mean that there are possibly other element(s)/component(s)/etc. apart from the listed element(s)/component(s)/etc.

Other embodiments of the present disclosure will be apparent to those skilled in the art from considering the specification and practicing the invention disclosed herein. Accordingly, this disclosure is intended to cover all and any variations, uses, or adaptations of the disclosure which follow, in general, the principles thereof and include such departures from the present disclosure as come within common knowledge or customary practice within the art to which the invention pertains. It is also intended that the specification and examples be considered as exemplary only, with true scope and spirit of the disclosure being indicated by the appended claims.

The invention claimed is:

1. A data read/write method for a dynamic random-access memory (DRAM), comprising:
   entering a page read/write mode configured by a reserved bit in a mode register of the DRAM;
   receiving a page read/write command including a page read/write enable command configured by a reserved bit in a read/write command of the DRAM; and
   performing a page read/write operation according to the page read/write command, wherein the page read/write command further comprises a page read/write length command, the page read/write length command indicates a read/write length of each page read/write operation and is configured by a burst length bit in the read/write command of the DRAM, and
   wherein the DRAM includes a Low-Power Double Data Rate 4 (LP-DDR4) synchronous DRAM (SDRAM), the reserved bit in the mode register includes a reserved bit in an MR1 mode register to configure a burst mode, the burst length bit includes a command bit corresponding to a CA5 pin, and the reserved bit in the read/write command includes a reserved command bit corresponding to a CA3 pin.

2. The data read/write method according to claim 1, wherein the page read/write length command is configured by both the burst length bit in the read/write command of the DRAM and at least one column address bit.

3. The data read/write method according to claim 2, wherein the at least one column address bit comprises one or two bits.

4. The data read/write method according to claim 2, wherein the at least one of column address bit includes a column address bit corresponding to a CA0 pin or column address bits corresponding to CA0 and CA1 pins.

5. The data read/write method according to claim 1, wherein the page read/write operation reads or writes data in N/16 of one page, wherein 1≤N≤16, and N is a natural number.

6. The data read/write method according to claim 5, wherein N=1, 2, 4 or 8.

7. The data read/write method according to claim 1, wherein the page read/write operation is performed in a linear manner automatically.

8. The data read/write method according to claim 7, wherein the linear manner includes a starting address and an increment from the starting address in each iteration.

9. The data read/write method according to claim 1, wherein the page read/write operation is performed across different pages or not across different pages.

10. The data read/write method according to claim 1, wherein the read/write length is configured with respect to a data amount requested by the page read/write command.

11. The data read/write method according to claim 1, wherein each of the reserved bit in the mode register and the reserved bit in the read/write command comprises one or two bits.

* * * * *